United States Patent [19]

Saleh

[11] 4,315,222

[45] Feb. 9, 1982

[54] POWER COMBINER ARRANGEMENT FOR MICROWAVE AMPLIFIERS

[75] Inventor: Adel A. M. Saleh, Holmdel, N.J.

[73] Assignee: Bell Telephone Laboratories, Incorporated, Murray Hill, N.J.

[21] Appl. No.: 127,785

[22] Filed: Mar. 6, 1980

[51] Int. Cl.³ .............................................. H03F 3/68
[52] U.S. Cl. ................................................ 330/124 D
[58] Field of Search ....................... 330/124 R, 124 D; 325/128, 178; 333/1.1, 24.2, 10; 307/219

[56] References Cited

U.S. PATENT DOCUMENTS

| | | | |
|---|---|---|---|
| 3,445,782 | 5/1969 | Sonkin ................................... | 330/124 |
| 3,928,806 | 12/1975 | Carter et al. .......................... | 325/128 |
| 3,930,205 | 12/1975 | Aeppli .............................. | 330/124 R |
| 4,010,426 | 3/1977 | Rambo ................................... | 330/53 |
| 4,028,632 | 6/1977 | Carter et al. ............................ | 330/53 |
| 4,064,464 | 12/1977 | Morse ..................................... | 330/53 |
| 4,068,228 | 1/1978 | Vallas ............................... | 330/124 R |

Primary Examiner—Michael J. Tokar
Attorney, Agent, or Firm—Erwin W. Pfeifle

[57] ABSTRACT

The present invention relates to an N-way non-hybrid power combiner arrangement for microwave amplifiers. In operation, sensing means ($19_1, 19_2, \ldots, 19_N$) are coupled in a one-to-one relationship with the individual amplifiers ($12_1, 12_2, \ldots, 12_N$) to monitor amplifier performance and sense amplifier failure. In one embodiment of the present invention, shorting devices ($20_1, 20_2, \ldots, 20_N$) are disposed adjacent to the outputs of the individual amplifiers and coupled to the associated sensing means in a one-to-one relationship. In an alternative embodiment, open-circuiting devices ($30_1, 30_2, \ldots, 30_N$) are disposed at a predetermined distance from the amplifier outputs along the transmission lines ($24_1, 24_2, \ldots, 24_N$) and coupled to their respective sensing means. Upon identifying amplifier failure, the sensing means coupled to that particular amplifier activates either its associated short-circuiting or open-circuiting device, which in turn uncouples the failed amplifier and the transmission line associated therewith.

7 Claims, 4 Drawing Figures

POWER COMBINER ARRANGEMENT FOR MICROWAVE AMPLIFIERS

BACKGROUND OF THE INVENTION

1. Field of the Invention

This invention relates to a novel power combiner arrangement for microwave power amplifiers, and more particularly, to a lossless power combiner in conjunction with a plurality of sensing devices, each sensing device disposed at a separate one of the input ports to the combiner, the sensing devices being able to identify and remove failed amplifiers at the input to the combiner and thereby improving the degradation performance of the system.

2. Description of the Prior Art

Solid-state microwave power amplifier units have power capacity too low for the output requirements of radar and communication systems. A number of different techniques for providing high power amplifiers for these systems are known in the prior art which overcome these power limitations imposed by individual solid state amplifier elements. A basic requirement of all such techniques, besides the obvious one of obtaining the combined output power of all the individual amplifiers, is for the total output power to fall gracefully as one or more of the component amplifiers suffer arbitrary modes of failure.

One such arrangement is discussed in the article "An N-Way Hybrid Power Divider" by E. J. Wilkinson in *IRE Transactions on Microwave Theory and Techniques*, Vol. MTT-8, No. 1, January 1960, at pp. 116-118. In the Wilkinson hybrid divider/combiner arrangement, the input ports are isolated from one another, as are the output ports. Therefore, when one or more amplifiers fail, the input and output impedances of each of the remaining amplifiers are unchanged.

A device capable of minimizing the degradation of the combined output power of microwave amplifiers upon such failure is disclosed in U.S. Pat. No. 3,928,806 issued to J. L. Carter et al on Dec. 23, 1975, which relates to a non-reciprocal power combiner. The combiner comprises N isolator-mismatch devices, each coupled to the output of one of a plurality of N microwave amplifiers, and a circulator coupled to the outputs of all of the mismatch devices. Each mismatch device is a two-port device that transmits power in one direction only, into the circulator. No reflected power is returned through any isolator-mismatch device to the amplifier; instead, any reflected power is absorbed by the mismatch device.

An alternative design is disclosed in U.S. Pat. No. 4,010,426 issued to S. I. Rambo on Mar. 1, 1977, which relates to an RF power amplifier redundant system employing three amplifiers. Under normal operation when all three amplifiers are functioning, the output from a comparator holds a 0 degree, 60 degree two-bit phase shifter in the 60 degree position. When any one of the amplifiers or any pair of amplifiers fail, the comparator output causes the two-bit phase shifter to switch to the 0 degree position. The system holds the power output constant at one-fourth the value of each individual amplifier for single or double failures. This one-fourth level, however, is undesirable in most communications applications.

A combiner capable of maintaining a higher power output level upon component failure is disclosed in U.S. Pat. No. 4,064,464 issued to A. W. Morse on Dec. 20, 1977, which relates to an amplitude stabilized power amplifier. A power splitter divides an input signal among a plurality of amplification channels, each having a power amplifier module. The separately amplified signals of the power channels are then recombined in a power combiner to provide the amplified power output signal. One of the power channels is also provided with a voltage controlled phase shifter whose phase shift is controlled by an operational amplifier which is responsive to a reference voltage and also responsive to the power level of the amplified output signal. The control amplifier controls the phase shift of the voltage controlled phase shifter such that when the power of the power amplifier output signal deviates from a predetermined level due to a failure along one of the amplifier channels, the operational amplifier causes the phase shifter to change the phase of the signal in its amplification channel. By this phase shift, the phase shifter affects the power combining efficiency of the power combiner to maintain the power of the power amplifier output signal at the predetermined level.

It has been suggested by R. L. Ernst in an article entitled "Graceful Degradation Properties of Matched N-Port Power Amplifier Combiners" in 1977 *IEEE MTT-S International Microwave Symposium Digest*, June, 1977 at pp. 174-177 that overall system performance may be significantly improved by replacing each failed amplifier with a "through" connection having the same phase delay as a working amplifier. The problem with this scheme, however, is in the practical difficulty of replacing a failed amplifier with an equal-phase "through" connection.

The problem remaining in the prior art, then, is to provide a means for improving the degradation performance of a microwave power amplifier that is both easy to implement and provides an output power level sufficient for radar and communication system applications.

SUMMARY OF THE INVENTION

The problem remaining in the prior art has been solved in accordance with the present invention, which relates to a novel power combiner arrangement for microwave power amplifiers, and more particularly, to a lossless power combiner in conjunction with a plurality of sensing devices, each sensing device disposed at a separate one of the input ports to the combiner, the sensing devices being able to identify and remove failed amplifiers at the input to the combiner and thereby improving the degradation performance of the system.

It is an aspect of the present invention to provide a microwave power amplifier that requires a non-hybrid, i. e., lossless power combiner. The non-hybrid power combiner may be any one of the various prior art combiners where the isolation resistors are removed. In addition, each input port to the combiner is equipped with a shorting device which is activated when the amplifier connected to it fails. An alternative is to open circuit the transmission line connected to the failed amplifier at the common point of the combiner.

It is another aspect of the present invention to provide a power combiner which eliminates excessive power dissipation due to the removal of isolation resistors normally found in prior art combiners in accordance with the present invention.

Other and further aspects of the present invention will become apparent during the course of the following description and by reference to the accompanying drawings.

BRIEF DESCRIPTION OF THE DRAWINGS

Referring now to the drawings, in which like numerals represent like parts in several views.

DETAILED DESCRIPTION

Figure 1:
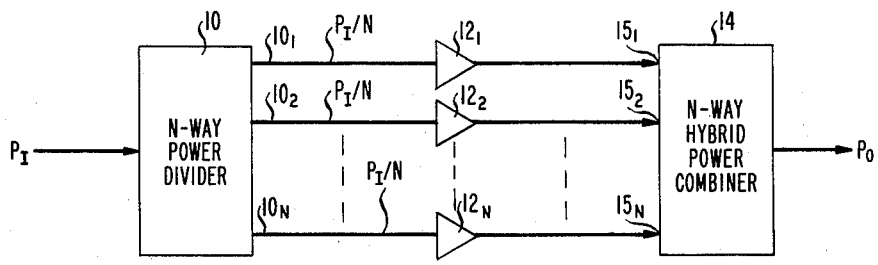
FIG. 1 illustrates an exemplary prior art microwave power amplifier comprising an N-way power divider and an N-way power combiner.

As shown in FIG. 1, a prior art power amplifier includes an N-way power divider 10 which is responsive to an input signal $P_I$ and which equally divides the input power $P_I$ into N output channels $10_1, 10_2, \ldots 10_N$ which supply N amplifiers $12_1, 12_2, \ldots 12_N$ with a signal having a power level $P_I/N$. The outputs of the amplifiers $12_1$ through $12_N$ are combined in a power combiner 14 through channels $15_1$ through $15_N$ respectively, to provide the amplified power output signal $P_o$. Devices such as power divider 10 and power combiner 14 are well known in the art and are described in the article discussed hereinbefore entitled "An N-Way Hybrid Power Divider" by E. J. Wilkinson. The particular amplifier $12_j$ of amplifiers $12_1$ through $12_N$ would depend upon the bandwidth, power level and frequency for which the amplifier is designed. In accordance with the Wilkinson hybrid divider/combiner arrangement, the input ports are isolated from one another, as are the output ports. Therefore, when one or more amplifiers fail, the input and output impedances of each of the remaining amplifiers are unchanged. Thus, if M out of N amplifiers fail, the output voltage becomes simply (N-M)/N times the corresponding no-failure voltage. Therefore, the corresponding output power $P'_o$ is represented by the equation $$P'_o/P_o = (1-M/N)^2, \tag{1}$$

where $P_o$ is the maximum power output, i.e., when M is equal to zero.

Figure 2:
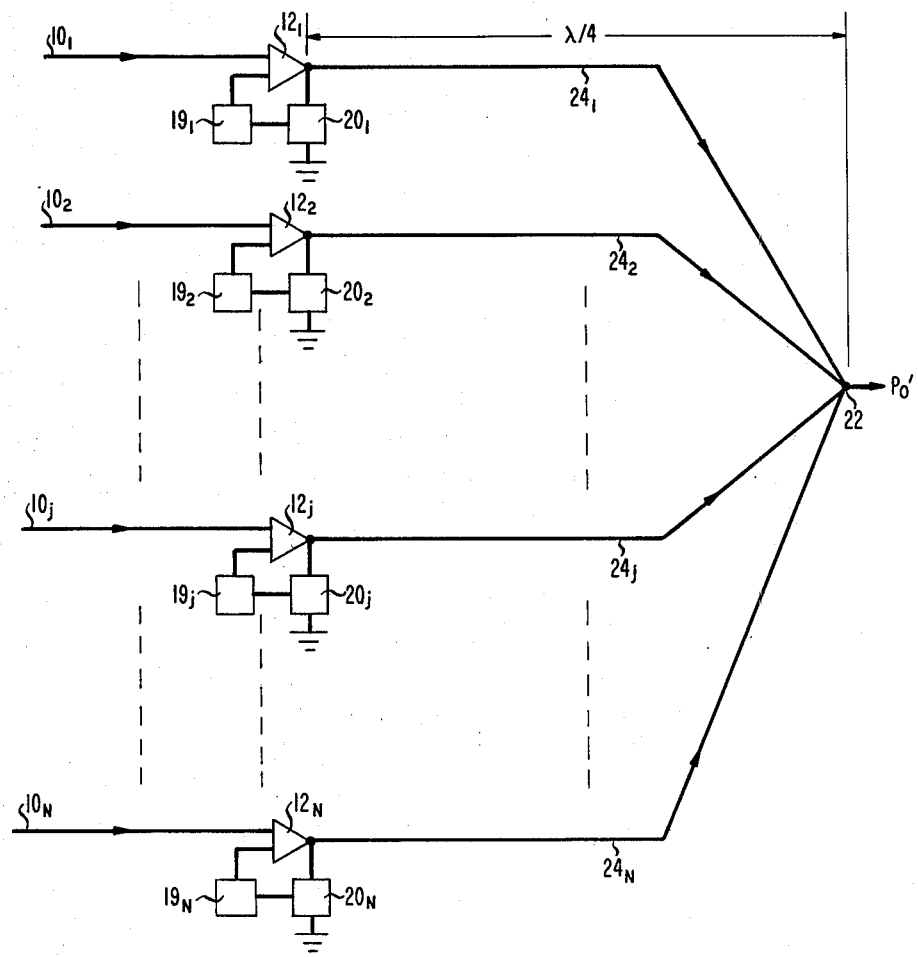
FIG. 2 illustrates an exemplary lossless microwave power combiner formed in accordance with the present invention.

One embodiment of the present invention is illustrated in FIG. 2 where N-way hybrid power combiner 14 of FIG. 1 is replaced by a non-hybrid power combiner arrangement including sensing means $19_1$ through $19_N$, shorting devices $20_1$ through $20_N$, and a common point 22. Specifically, sensing means $19_1$ through $19_N$ are coupled to amplifiers $12_1$ through $12_N$ in a one-to-one relationship, sensing means $19_1$ coupled to amplifier $12_1$, sensing means $19_2$ coupled to amplifier $12_2$, continuing in a like manner, with sensing means $19_N$ coupled to amplifer $12_N$. Similarly, shorting devices $20_1$ through $20_N$ are coupled in a one-to-one manner with the outputs of amplifiers $12_1$ through $12_N$, in a manner whereby the length of each transmission line $24_1$ through $24_N$ from amplifiers $12_1$ through $12_N$ to the common point 22 remains at a constant $\lambda/4$, where $\lambda$ is defined as the propagating wavelength of the input signal $P_I$, where $P_I$ is as defined hereinabove in the description associated with FIG. 1. Each shorting device $20_1$ through $20_N$ is also connected to its respective sensing means $19_1$ through $19_N$, shorting device $20_1$ connected to sensing means $19_1$, shorting device $20_2$ connected to sensing means $19_2$, continuing in a like manner, with shorting device $20_N$ connected to sensing means $19_N$.

In operation, sensing means $19_1$ through $19_N$ monitor the operation of their respective amplifiers $12_1$ through $12_N$, and are capable of sensing an amplifier failure. Amplifier failure could be sensed, for example, by noting a large change in its d-c bias current. Upon failure of a specific amplifier, for example, amplifier $12_j$, its related sensing means $19_j$ would activate its associated shorting device $20_j$. In design, shorting device $20_j$ may be, but need not be limited to, a mechanical short activated by sensing means $19_j$ or a shunt PIN diode that is biased in its forward direction through sensing means $19_j$.

From well-known principles of microwave theory, it can be shown that if M of the N amplifiers $12_1$ through $12_N$ fail, the total output power $P'_o$ available at common point 22 in the arrangement of the present invention is given by $$P'_o/P_o = [1-M/(2N-M)]^2, \tag{2}$$

where $P_o$ is the maximum power output, i.e., when M is equal to zero.

Figure 3:
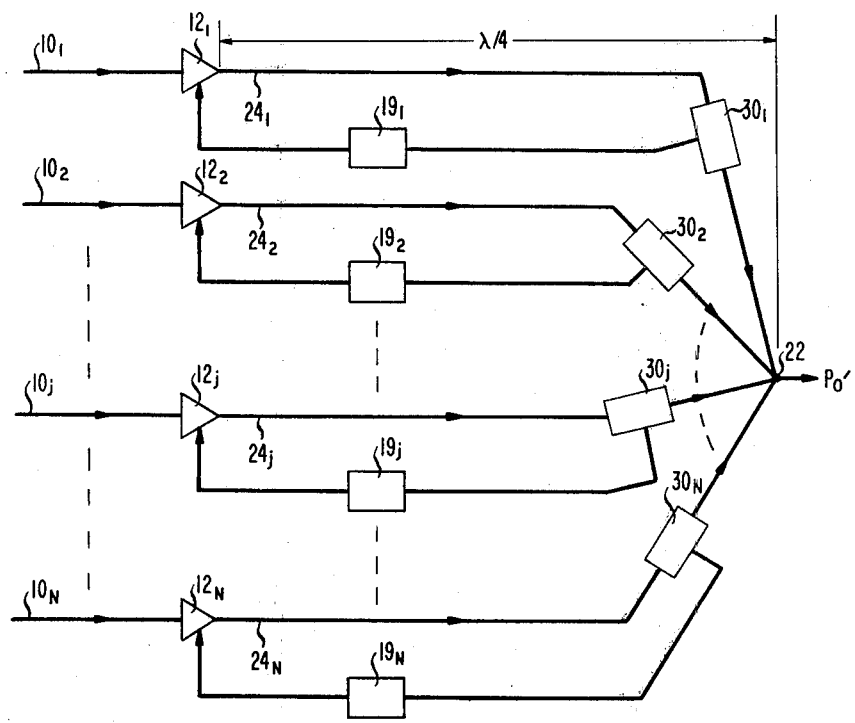
FIG. 3 illustrates an alternative arrangement of a lossless microwave power combiner formed in accordance with the present invention.

An alternative arrangement of the present invention, as illustrated in FIG. 3, requires replacing shorting devices $20_1$ through $20_N$ with a bank of open-circuiting devices $30_1$ through $30_N$. Specifically, open-circuiting devices $30_1$ through $30_N$ are coupled to transmission lines $24_1$ through $24_N$ at their respective junctions with common point 22. Like shorting devices $20_1$ through $20_N$ associated with the arrangement illustrated in FIG. 2, open-circuiting devices $30_1$ through $30_N$ must be coupled to common point 22 in a manner whereby the length of each transmission line $24_1$ through $24_N$ remains at a constant $\lambda/4$, where $\lambda$ is defined as the propagating wavelength of the input signal $P_I$, where $P_I$ is as defined hereinbefore in the description associated with FIG. 1.

Upon failure of a specific amplifier, for example, amplifier $12_j$, its related sensing means $19_j$ activates open-circuiting device $30_j$. Amplifier failure could be identified by various alternative methods known in the art, as stated hereinabove in association with FIG. 2. In design, open-circuiting device $30_j$ may be, but need not be limited to, an electromagnet activated by sensing means $19_j$ or a fuse element activated by sensing means $19_j$.

Using well-known principles of microwave theory, the arrangements illustrated in FIGS. 2 and 3 are found to be electrically equivalent, which implies that the total output power $P'_o$ of the arrangement disclosed in FIG. 3 is identical to that discussed hereinabove in association with FIG. 2, and may be determined from the above-mentioned equation (2).

Figure 4:
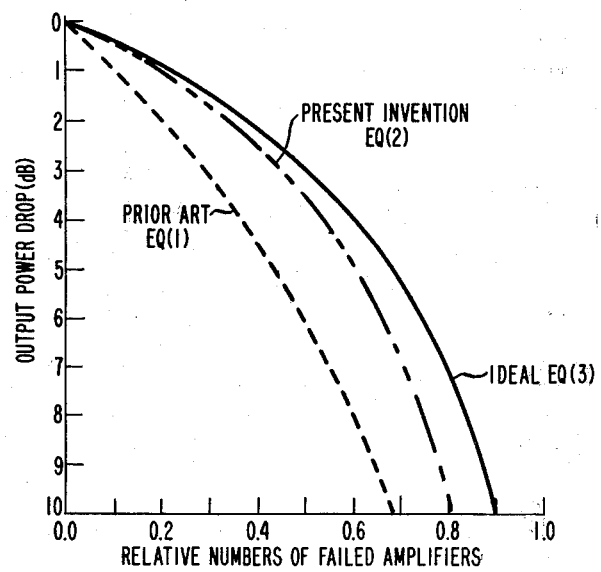
FIG. 4 contains various curves illustrating the degradation in power output of combined amplifiers versus the relative number of failed amplifiers, where the solid curve represents the ideal case, the equal-segment curve is associated with prior art power combiners, and the unequal-segment curve represents a power combiner formed in accordance with the present invention.

This output power $P'_o$ associated with the arrangements of either FIG. 2 or FIG. 3 may be plotted in decibels versus the quantity M/N as represented by the unequal-segment dashed line in FIG. 4. For comparison, a plot associated with an exemplary Wilkinson hybrid combiner in accordance with equation (1) is represented by the equal-segment dashed line in FIG. 4. The solid line in FIG. 4 illustrates the ideal condition, which may be represented by the equation $$\frac{\Sigma P_{remaining}}{P_o} = 1 - \frac{M}{N}. \quad (3)$$

It can be seen by direct comparison to the prior arrangement, that the arrangement of the present invention is a closer approximation to the ideal case at all levels of performance. For example, when half of the amplifiers fail, the prior art arrangement's output power would drop approximately 6.5 dB, while the arrangement formed in accordance with the present invention only drops approximately 3.5 dB, approaching the ideal value of 3 dB.

It is to be understood that the above-described embodiments are simply illustrative of the principles of the invention. Various other modifications may be made by those skilled in the art which will embody the principles of the invention and fall within the spirit and scope thereof.

I claim:

1. A microwave power combiner arrangement comprising:
    N microwave amplifiers ($12_1, 12_2, \ldots, 12_N$), each amplifier capable of receiving and amplifying a separate one of a plurality of N input signals;
    N transmission lines ($24_1, 24_2, \ldots, 24_N$), each transmission line of a predetermined length $\lambda/4$ and coupled to the output of a separate one of said N microwave amplifiers; and
    a common point (22) coupled to each transmission line at said predetermined length $\lambda/4$ from its associated amplifier, capable of combining said N amplified input signals;
    CHARACTERIZED IN THAT
    the microwave power combiner arrangement further comprises
    N sensing means ($19_1, 19_2, \ldots, 19_N$), each sensing means coupled to a separate one of the N microwave amplifiers and capable of sensing an amplifier failure; and
    N devices ($20_1, 20_2, \ldots, 20_N; 30_1, 30_2, \ldots, 30_N$), each device coupled between a separate one of said N sensing means and an end of the transmission line associated therewith capable of being activated by said sensing means and coupling said transmission line and the common point.

2. A microwave power combiner in accordance with claim 1
    CHARACTERIZED IN THAT
    the N devices ($20_1, 20_2, \ldots, 20_N$) are disposed at the ends of the N transmission lines coupled to the N amplifiers, each device comprising a short-circuiting component capable of being activated by its coupled sensing means and coupling the associated transmission line with ground.

3. A microwave power combiner in accordance with claim 1 or 2
    CHARACTERIZED IN THAT
    each device ($20_1, \ldots, 20_N$) comprises an electromagnetic component capable of being activated by its coupled sensing means and coupling the associated transmission line with ground.

4. A microwave power combiner in accordance with claim 1 or 2
    CHARACTERIZED IN THAT
    each device ($20_1, \ldots, 20_N$) comprises a shunt PIN diode biased in the forward direction by its coupled sensing means and capable of coupling the associated transmission line with ground.

5. A microwave power combiner in accordance with claim 1
    CHARACTERIZED IN THAT
    the N devices ($30_1, 30_2, \ldots, 30_N$) are disposed at the ends of the N transmission lines adjacent the common point, each device comprising an open-circuiting component capable of being activated by its coupled sensing means and uncoupling the transmission line and said common point.

6. A microwave power combiner in accordance with claim 1 or 5
    CHARACTERIZED IN THAT
    each device ($30_1, 30_2, \ldots, 30_N$) comprises an electromagnetic component capable of being activated by its associated sensing means and uncoupling the transmission line and the common point.

7. A microwave power combiner in accordance with claim 1 or 5
    CHARACTERIZED IN THAT
    each device ($30_1, 30_2, \ldots, 30_N$) comprises a fuse element capable of being activated by its associated sensing means and uncoupling the transmission line and the common point.

* * * * *

UNITED STATES PATENT AND TRADEMARK OFFICE
CERTIFICATE OF CORRECTION

PATENT NO. : 4,315,222
DATED : February 9, 1982
INVENTOR(S) : Adel A. M. Saleh

It is certified that error appears in the above–identified patent and that said Letters Patent are hereby corrected as shown below:

Column 6, line 1, "coupling" should read --uncoupling--.

Signed and Sealed this

Twentieth Day of April 1982

[SEAL]

Attest:

GERALD J. MOSSINGHOFF

*Attesting Officer*     *Commissioner of Patents and Trademarks*